United States Patent [19]

Takayama et al.

[11] Patent Number: 4,661,815

[45] Date of Patent: Apr. 28, 1987

[54] GATE ARRAY INTEGRATED DEVICE HAVING MIXED SINGLE COLUMN TYPE AND MATRIX TYPE ARRAYS

[75] Inventors: Yoshihisa Takayama, Kawasaki; Shigeru Fujii, Yokohama; Kazuyuki Kawauchi, Yokohama; Toshihiko Yoshida, Yokohama, all of Japan

[73] Assignee: Fujitsu Limited, Kawasaki, Japan

[21] Appl. No.: 782,923

[22] Filed: Oct. 2, 1985

[30] Foreign Application Priority Data

| Oct. 3, 1984 | [JP] | Japan | 59-206144 |
| Oct. 22, 1984 | [JP] | Japan | 59-220447 |
| Oct. 22, 1984 | [JP] | Japan | 59-220450 |
| Dec. 28, 1984 | [JP] | Japan | 59-274504 |

[51] Int. Cl.$^4$ .................... H04Q 1/00; H01L 29/78; H03K 19/177

[52] U.S. Cl. .................... 340/825.86; 307/445; 357/45

[58] Field of Search .................... 340/825.86, 825.87; 307/445, 465; 357/45, 42

[56] References Cited

U.S. PATENT DOCUMENTS

| 4,161,662 | 7/1979 | Malcolm et al. | 307/465 |
| 4,564,773 | 1/1986 | Tanizawa et al. | 307/445 |
| 4,602,270 | 7/1986 | Finegold et al. | 357/45 |
| 4,611,236 | 9/1986 | Sato | 357/45 |

*Primary Examiner*—Donald J. Yusko
*Attorney, Agent, or Firm*—Staas & Halsey

[57] ABSTRACT

A gate array integrated device including a plurality of single column type arrays, a plurality of matrix type arrays such as double column type arrays (BC2), and longitudinal connection areas (CH) provided between the single column type arrays and the matrix type arrays. One of the single column type arrays facing at least one side of each of the matrix type arrays.

10 Claims, 31 Drawing Figures

GATE ARRAY INTEGRATED DEVICE HAVING MIXED SINGLE COLUMN TYPE AND MATRIX TYPE ARRAYS

BACKGROUND OF THE INVENTION

1. Field of the Invention

The present invention relates to a gate array integrated device.

2. Description of the Related Art

In general, since large integrated circuits (LSI) such as complex integrated logic circuits are manufactured in accordance with customers' requirements for a preferred design or development requirements, a small quantity of a large number of different circuits are manufactured. In order to promptly manufacture such circuits at a low cost, a gate array (master slice) method has been suggested.

According to the gate array method, a large number of basic cells are regularly manufactured in advance, and as customers' request, or as development requires, connection masks for unit cells are designed and manufactured, so that the inner connections within the basic cells and the connections therebetween are manufactured. Therefore, since the configuration of the basic cells is common, the manufacturing or development term is reduced, and accordingly, the manufacturing or development cost is reduced.

Note that a basic cell configuration is determined by impurity diffusion regions within a semiconductor substrate having interconnections. Accordingly, this is called a bulk configuration.

The present invention is directed to improving such a bulk configuration.

A prior art bulk configuration consists of a plurality of single column type arrays each of which includes a series of basic cells arranged along the column direction of the device. In such a bulk configuration, however, when unit cells are constructed, the longitudinal length thereof is increased and this causes deterioration of the characteristics of the signal transmission speed and the like. In addition, the connections between the basic cells become long, and it sometimes becomes necessary to increase the connection areas between the single column type arrays, which is disadvantageous from the viewpoint of integration.

To avoid the disadvantages in the above-mentioned single column type array, a bulk configuration has been suggested which includes a plurality of matrix type arrays such as double column type arrays. In a matrix type array bulk configuration, however, it sometimes becomes impossible to arrange the connections for unit cells, since the redundancy of connections for unit cells is small, as will be explained later.

SUMMARY OF THE INVENTION

It is an object of the present invention to provide a gate array integrated device having a redundancy of connections for connection areas, excellent operating characteristics, i.e., the signal transmission speed, etc. and a high integration density.

According to the present invention, a gate array integrated device is provided including a plurality of single column type arrays, a plurality of matrix type arrays such as double column type arrays, and longitudinal connection areas provided between the arrays. One of the single column type arrays faces at least one side of each of the matrix type arrays.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENTS

First, an example of a basic cell will now be explained with reference to FIGS. 1, 2, 3, and 4.

Figure 1:
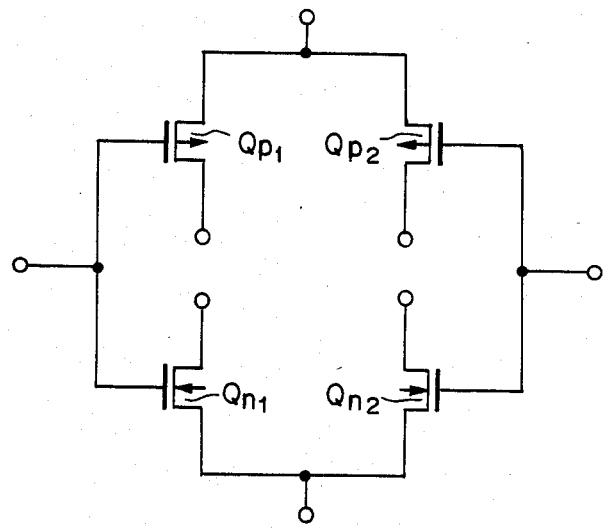
FIG. 1 is a circuit diagram of a complementary metal insulator semiconductor (CMIS) basic cell.
Figure 2:
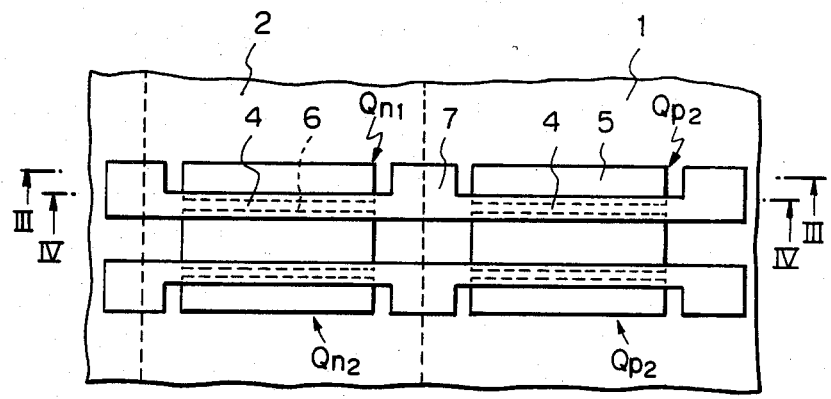
FIG. 2 is a plan view of the basic cell of FIG. 1.
Figure 3:
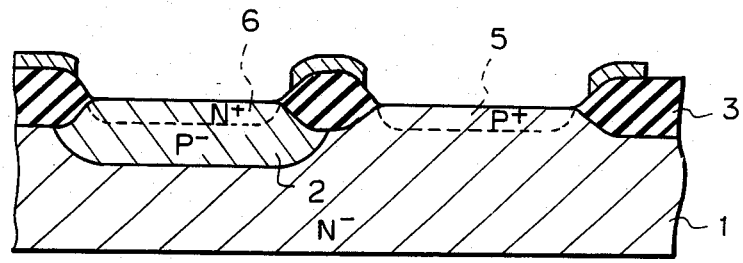
FIGS. 3 and 4 are cross-sectional views taken along the lines III—III and IV—IV, respectively, of FIG. 2.
Figure 4:
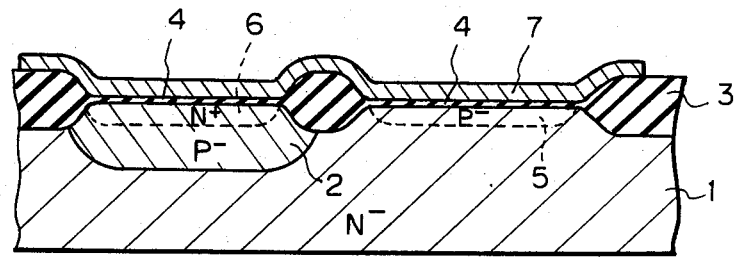
Figure 6:
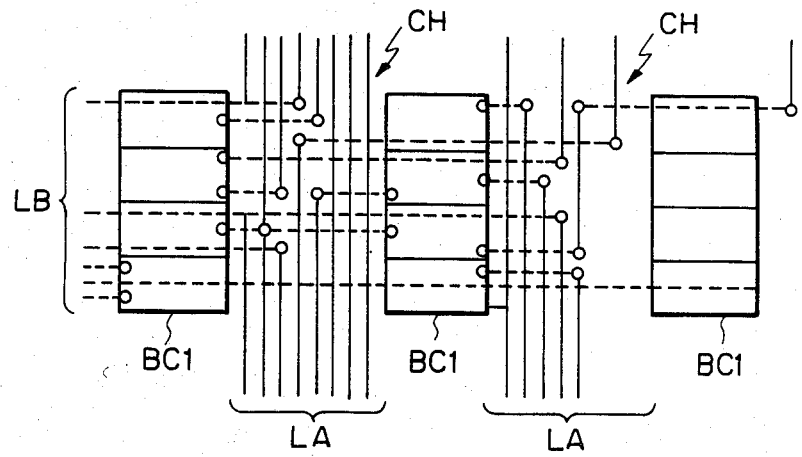
FIG. 6 is a diagram of unit cells connected to the basic cells of FIG. 5.

FIG. 1 is a circuit diagram of a CMIS basic cell. The basic cell includes a pair of P-channel transistors $Q_{p1}$ and $Q_{p2}$ having a common source and a pair of N-channel transistors $Q_{n1}$ and $Q_{n2}$ having a common source. In this case, the gates of the P-channel transistor $Q_{p1}$ and the N-channel transistor $Q_{n1}$ are connected to each other, and the gates of the P-channel transistor $Q_{p2}$ and the N-channel transistor $Q_{n2}$ are connected to each other. Referring to FIG. 2, which is a plan view of the basic cell of FIG. 1, and FIGS. 3 and 4, which are cross-sectional views, taken along the line III—III and IV—IV, respectively, of FIG. 2, reference numeral 1 designates an $N^-$-type monocrystalline silicon substrate having a $P^-$-type well 2 for the N-channel transistors $Q_{n1}$ and $Q_{n2}$. Further, a field oxide layer 3 for isolating transistors (active areas) from each other is formed thereon, and a gate oxide layer 4 is formed on each active area. Further, $P^+$-type impurity diffusion regions 5 are formed for the P-channel transistors $Q_{p1}$ and $Q_{p2}$, and $N^+$-type impurity diffusion regions 6 are formed for the N-channel transistors $Q_{n1}$ and $Q_{n2}$. Finally, a polycrystalline silicon layer 7 is formed for connecting the gates of the transistors $Q_{p1}$ and $Q_{n1}$ and connecting the gates of the transistors $Q_{p2}$ and $Q_{n2}$, thus completing the bulk process of a gate array LSI. After that, as occasion demands, that is, as customers demand or development demands, connection patterns are formed on the basic cell as shown in FIGS. 2 through 4.

Figure 5:
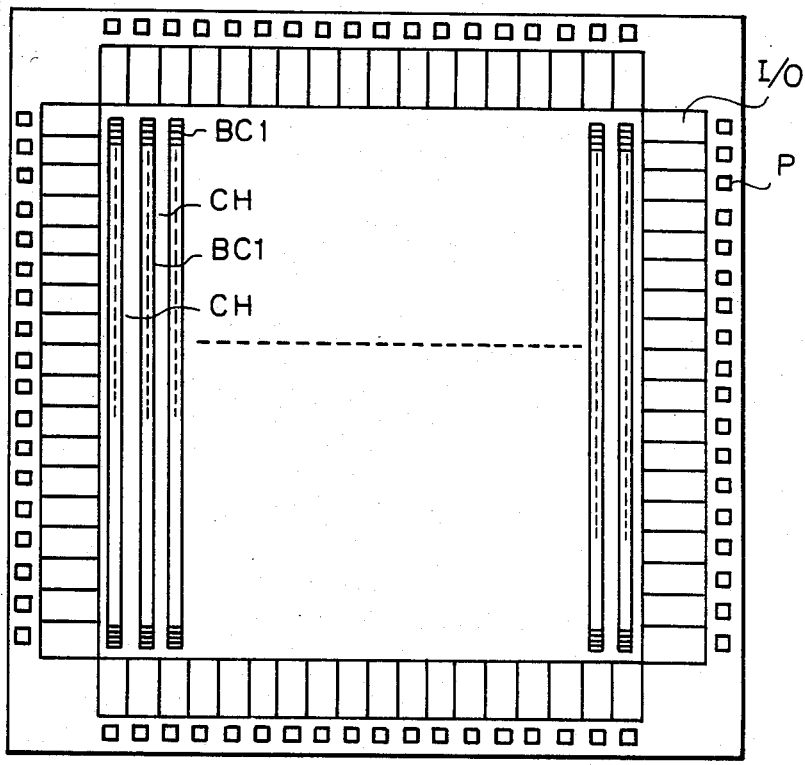
FIG. 5 is a plan view of a prior art gate array integrated device.

In prior art FIG. 5, basic cells are arranged at the center of a chip. That is, each single column type array BC1 includes a series of basic cells along the column direction of the chip, and connection (channel) areas CH are provided between the arrays BC1. In FIG. 5, I/O designates an input/output circuit providing a connection to the exterior, and P designates a pad.

Figure 7:
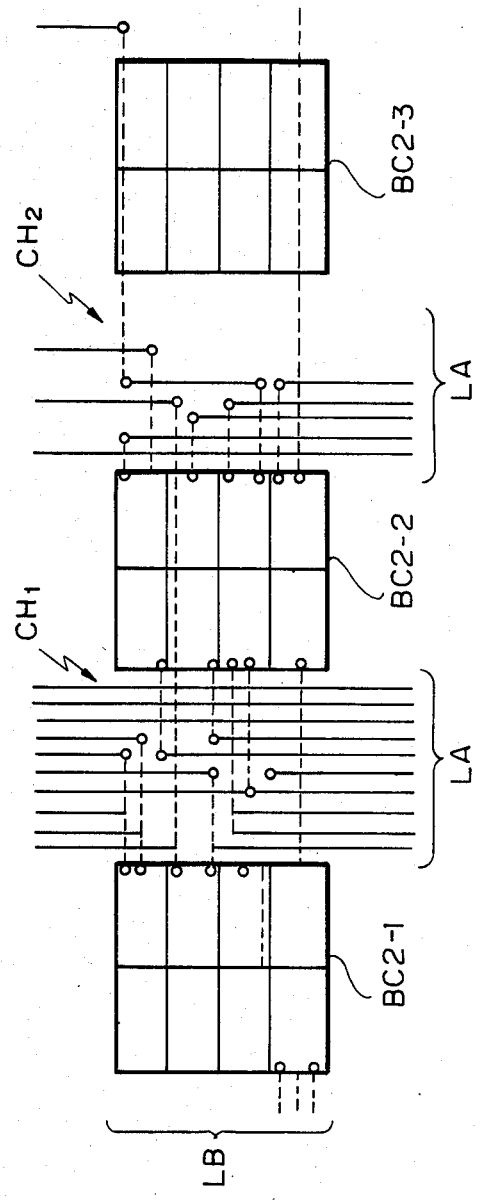
FIG. 7 is a diagram of unit cells connected to double column type basic cells.

Examples of unit cells formed on the above-mentioned single column type arrays BC1 are illustrated in FIG. 7. That is, connections LA parallel to the arrays BC1 indicated by solid lines are formed by a first aluminium layer, and connections LB perpendicular to the arrays BC1 indicated by dotted lines are formed by a second aluminium layer. Thus, connections within the unit cells and connections therebetween are formed by the connections LA and LB.

However, when unit cells are formed on the single column type arrays BC1, the length of one unit cell becomes large, thereby increasing the length of the above-mentioned connections LA and LB, and reducing circuit characteristics such as the signal transmission speed and the like. In addition, as the result of the increased length of the connections LA and LB, each connection channel area CH between the single column type arrays BC1 must be large, which is disadvantageous from the viewpoint of integration.

Note that, in order to remove the above-mentioned disadvantages, one approach is to construct a basic cell array as a matrix type array, such as a double column type array. This reduces the length of the unit cells and improves the characteristics such as the signal transmission speed, and therefore, reduces the length of the connections LA and LB. In addition, since the connection areas between the matrix type arrays are decreased, the integration density of the device is improved. However, as illustrated in FIG. 7, when all of the basic cell arrays are constructed as double column type arrays BC2-1, BC2-2, BC2-3, . . . , connections for unit cells must be on one side of this array BC2-2, so that even if there is no room on one side of the double column type array BC2-2, i.e., in a connection area $CH_1$, and there is room on the other side of the double column type array BC2-2, i.e., in a connection area $CH_2$, it sometimes becomes impossible to arrange the necessary connections for unit cells of the double column type array BC2-2.

Figure 8:
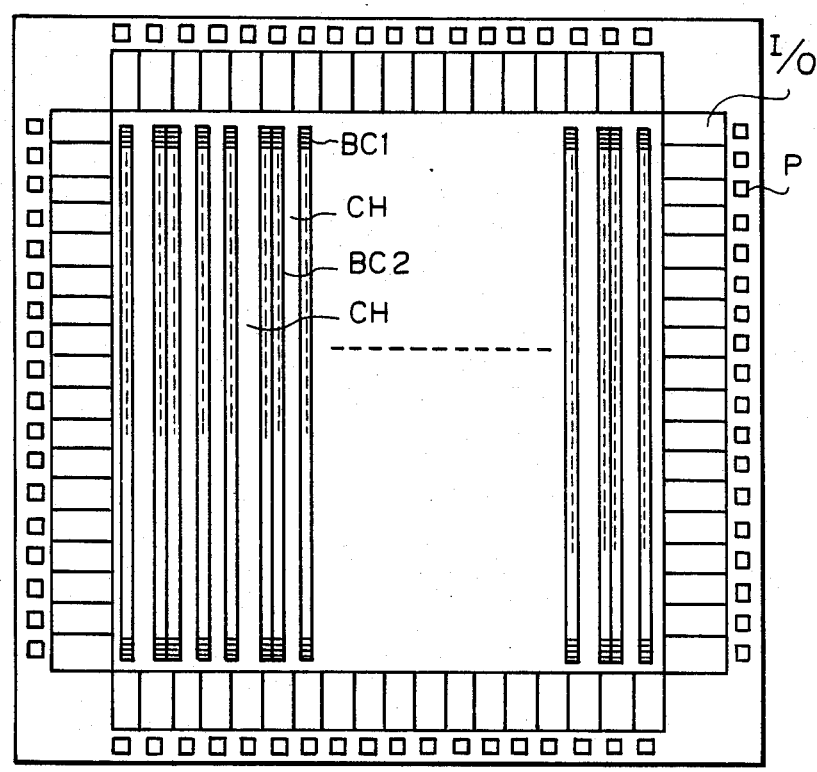
FIG. 8 is a plan view of an embodiment of a gate array integrated device according to the present invention.
Figure 9:
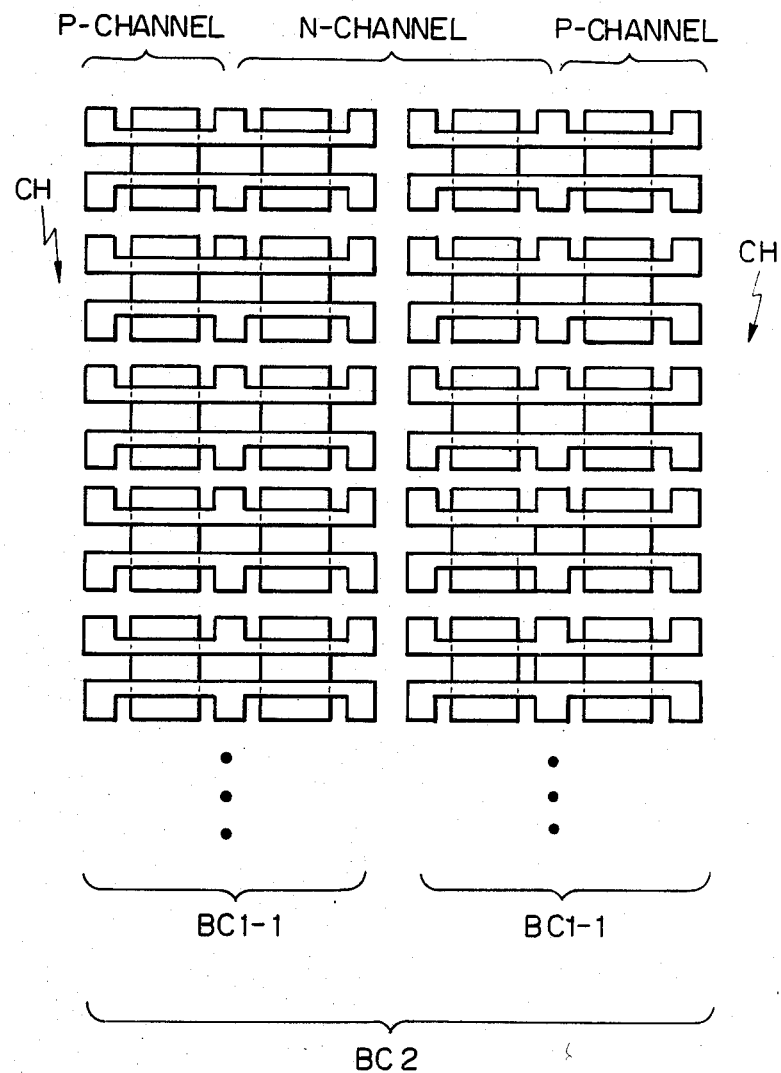
FIG. 9 is an enlargement of the double column type array of FIG. 8.

In FIG. 8, which is an embodiment of the present invention, double column type arrays BC2, as illustrated in detail in FIG. 9, are arranged between single column type arrays BC1. As illustrated in FIGS. 8 and 9, a connection area CH is provided on the outside of the double column type array BC2. However, there is no connection area between the single column type arrays BC1-1 and BC1-2 of the double column type array BC2. In addition, the single column type arrays BC1-1 and BC1-2 within the double column type array BC2 have a symmetric configuration.

Figure 10:
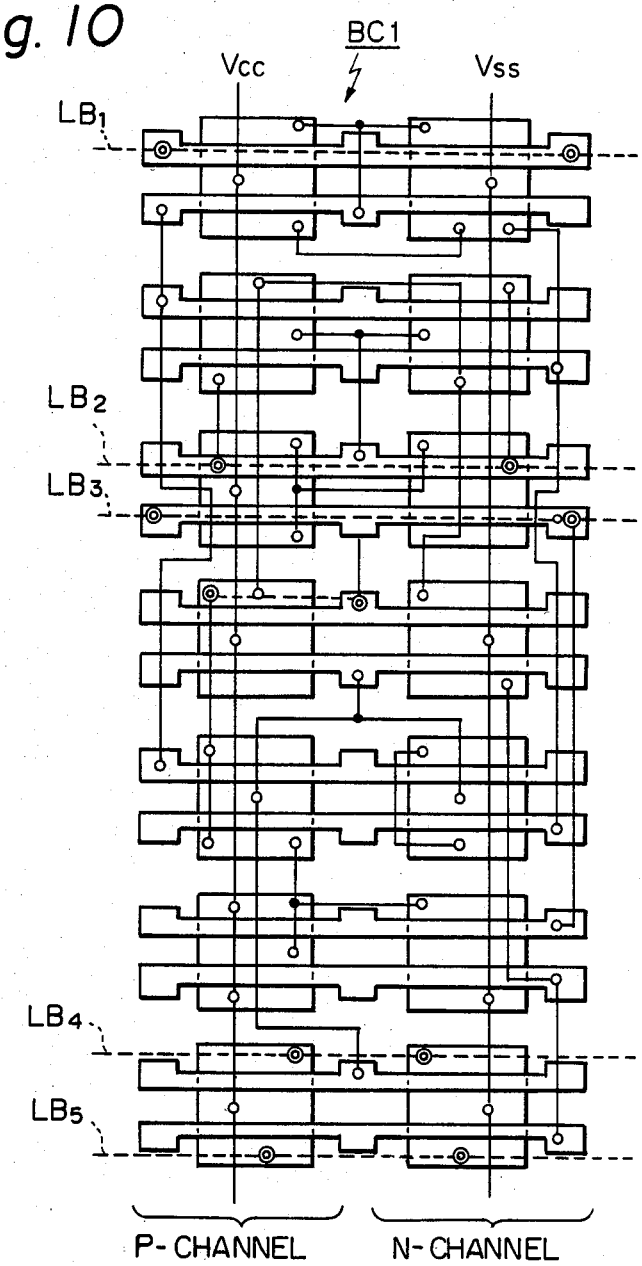
FIG. 10 is a diagram for unit cells connected to the single column type array of FIG. 1.
Figure 11:
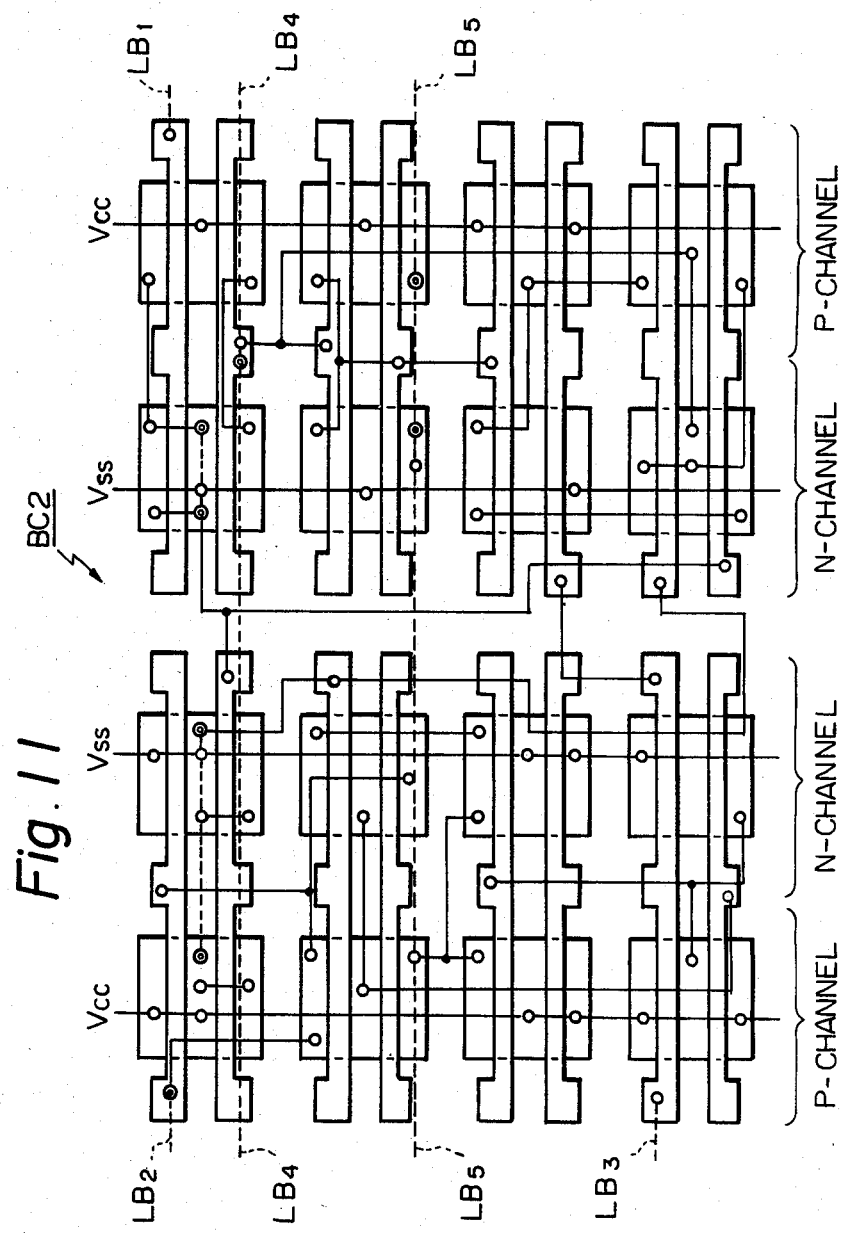
FIG. 11 is a connection diagram for unit cells connected to the double column type array of FIG. 1.

FIG. 10 is a plan view of an example of connections for unit cells applied to the single column type array BC1 of FIG. 8, and FIG. 11 is a plan view of connections for the same unit cells applied to the double column type array BC2 of FIG. 8. Comparing FIG. 10 with FIG. 11, in FIG. 10, the number of stages of basic cells used is eight, while in FIG. 11, the number of stages of basic cells used is four. Therefore, the connections made of the first aluminium layer within the basic cell array (which is indicated by solid lines and whose contacts are indicated by single open circles) in FIG. 11 are relatively short compared with those in FIG. 10. In addition, the connections $LB_1$ to $LB_5$ of the second aluminium layer for unit cells (which are indicated by dotted lines and whose contacts are indicated by concentric circles) in FIG. 11 are closer together compared with those in FIG. 10. As a result, the number of connections arranged at the connection areas CH for other unit cells can be reduced, and the length of the connections can also be reduced.

In FIG. 10, all the connections $LB_1$ through $LB_5$ are located on both sides of the single column type array BC1. Therefore, any connection channel areas on either side of the single column type array BC1 can be used. On the other hand, in FIG. 11, the connections $LB_1$, $LB_2$, and $LB_3$ are located on one side of the double column type array BC2, and the connections $LB_4$ and $LB_5$ are located on both sides thereof. That is, the connections $LB_1$ through $LB_3$ must be connected at a connection area on one side thereof.

In FIG. 8, a single column type array BC1 faces at least one side of a double column type array BC2. Therefore, since the single column type array BC1 can use one connection area at either side thereof, the limitations on the use of the connection areas on the sides of the double column type array BC2 can be sufficiently lowered. That is, if the determination of connections of unit cells for the double column type arrays BC2 is carried out prior to the determination of connections of unit cells for the single column type arrays BC1, the possibility of non-connections can be reduced.

Usually, basic cells are divided into unit cells such as a 4-input NAND circuit, a 4-input NOR circuit, a 6-input NAND circuit, a 6-input NOR circuit or the like. In this case, a 3-input NAND circuit is allocated the same area as a 4-input NOR circuit, a 3-input NOR circuit is allocated the same area as a 3-input NOR circuit, and a 5-input NOR circuit is allocated the same area as a 6-input NOR circuit.

Figure 12A:
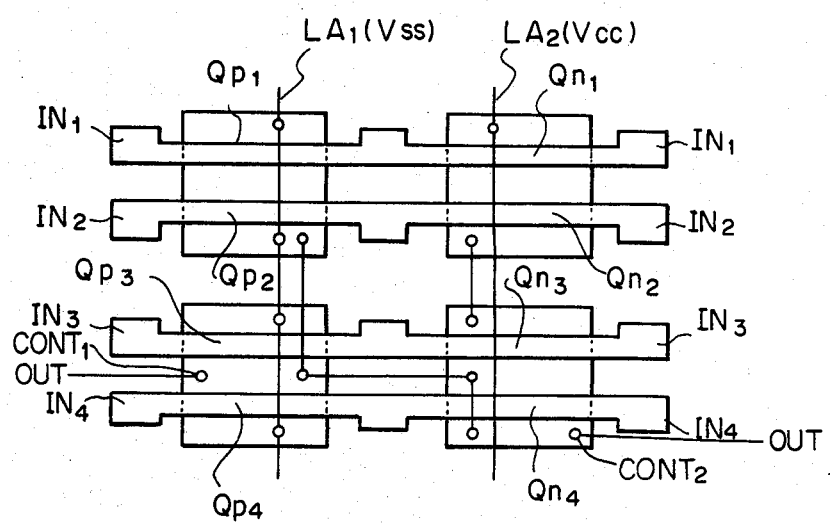
FIG. 12A is a plan view of connections of two basic cells for a 4-input NAND circuit unit cell.
Figure 12B:
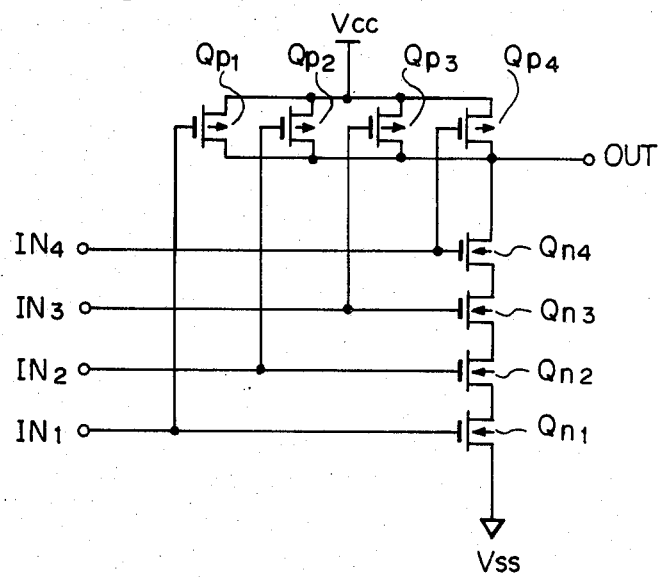
FIG. 12B is a circuit diagram of the unit cell of FIG. 12A.

For example, as illustrated in FIG. 12A, a 4-input NAND circuit comprises four P-channel transistors $Q_{p1}$ through $Q_{p4}$ and four N-channel transistors $Q_{n1}$ through $Q_{n4}$. The common gate of the transistors $Q_{p1}$ and $Q_{n1}$ serves as an input terminal $IN_1$, the common gate of the transistors $Q_{p2}$ and $Q_{n2}$ serves as an input terminal $IN_2$, the common gate of the transistors $Q_{p3}$ and $Q_{n3}$ serves as an input terminal $IN_3$, and the common gate of the transistors $Q_{p4}$ and $Q_{n4}$ serves as an input terminal $IN_4$. An output OUT is taken from the drain of the transistor $Q_{n4}$ via a contact $CONT_2$ through an aluminium connection. FIG. 12B is an equivalent circuit of FIG. 12A.

Figure 13:
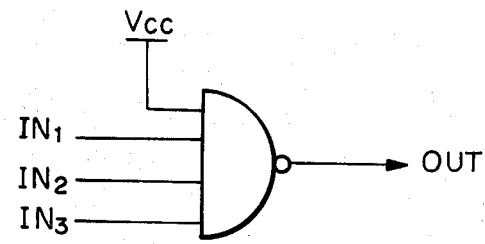
FIGS. 13 and 14 are logic circuit diagrams for explaining a clip method.

In order to apply the unit cell for a 4-input NOR circuit to a 3-input NAND circuit, one input terminal such as $IN_4$ can be connected to a power supply line $LA_2$ ($V_{CC}$). Thus, the logic circuit illustrated in FIG. 13 is obtained.

Similarly, in order to apply the unit cell for a 4-input NOR circuit to a 3-input NOR circuit, one input terminal can be connected to a power supply line $LA_1$ ($V_{SS}$). Thus, the logic circuit of FIG. 14 can be obtained.

The connection of one input terminal to a power supply line as explained above is called a "clip".

Figure 15:
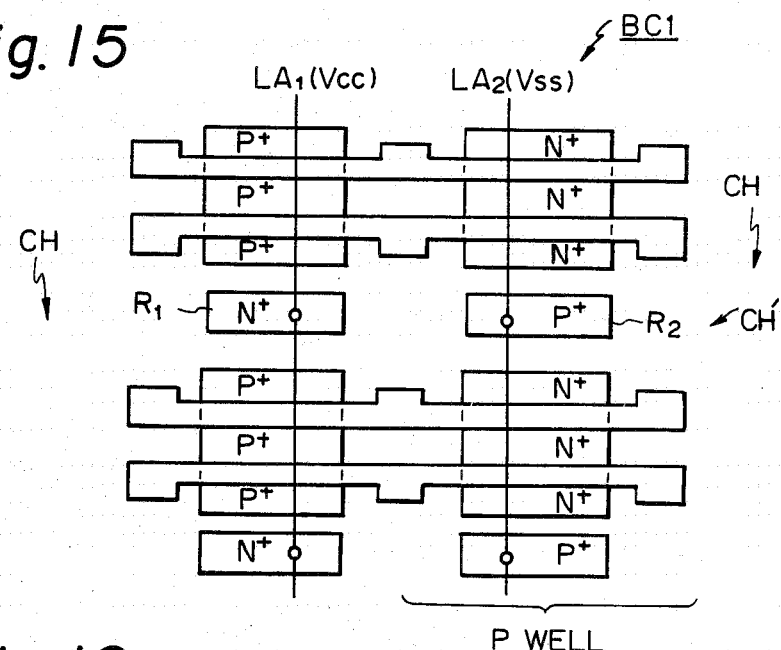
FIG. 15 is an enlargement of the single column type array of FIG. 8, in which impurity diffusion regions are provided for avoiding the latch-up phenomenon.

In FIG. 15, which is an enlargement of the single column type array BC1 of FIG. 8, traverse connection areas CH′ are provided between the basic cells of the single column type array BC1. Formed in each of the traverse connection areas CH′ are impurity diffusion regions $R_1$ and $R_2$ for avoiding the latch-up phenomenon peculiar to the CMIS configuration. That is, the impurity diffusion region $R_1$, which is, in this case, N+ type, is used for producing a negative bias voltage in the substrate 1 (FIGS. 2 to 4), and the impurity diffusion region $R_2$, which is, in this case, P+ type, produces a positive bias voltage in the P well 2 (FIGS. 2 to 4). For this purpose, the N+ impurity diffusion region $R_1$ is connected via a contact to the power supply connection layer $LA_1$ ($V_{CC}$), and the P+ impurity diffusion region $R_2$ is connected via a contact to the power supply line $LA_2$ ($V_{SS}$).

Figure 16:
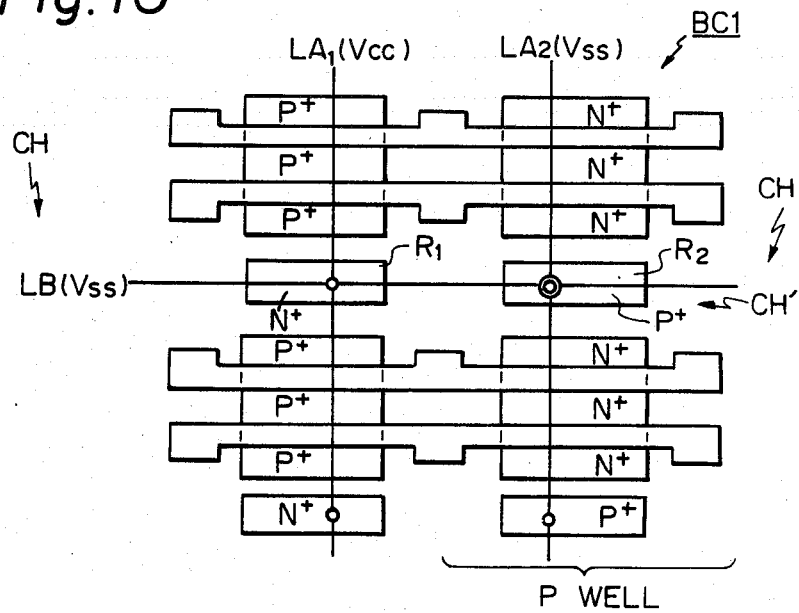
FIG. 16 is a modification of FIG. 15, in which a power supply line is added thereto.

In FIG. 16, which is a modification of FIG. 15, in addition to the longitudinal power supply connection layers $LA_1$ and $LA_2$, a traverse power supply connection layer LB is added to reduce the impedance of the power supply lines for unit cells. In FIG. 16, note that the traverse power supply connection layer LB ($V_{SS}$) is connected via a contact to the longitudinal connection layer (in this case, $LA_2$), but the connection layer $LA_2$ is not connected to the P+ impurity diffusion $R_2$. That is, to avoid disconnections, double contacts are prohibited.

A clip method for a single column type array having traverse connection areas for impurity diffusion regions and traverse power supply connection layers will be explained below.

Figure 17:
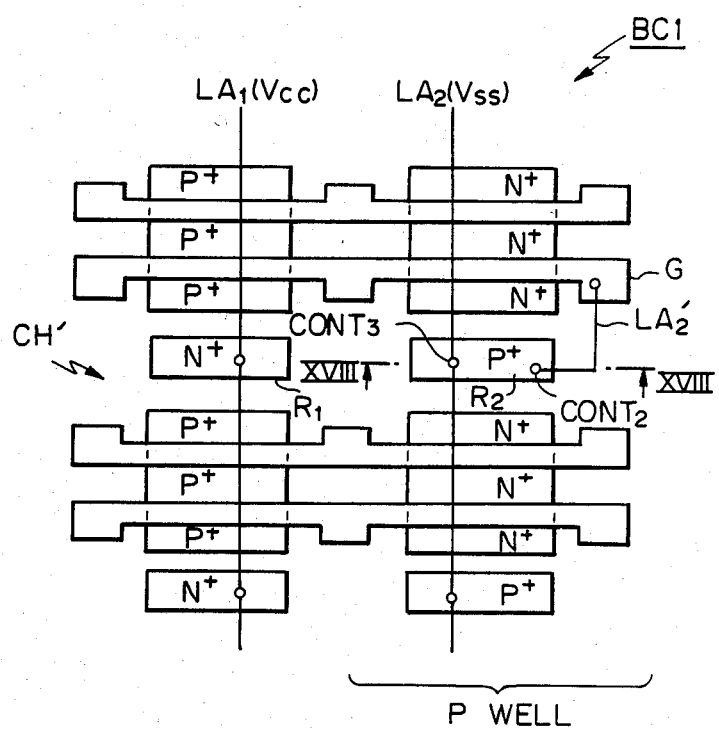
FIG. 17 is a plan view of a clip method according to the present invention applied to the single column type array of FIG. 15.
Figure 18:
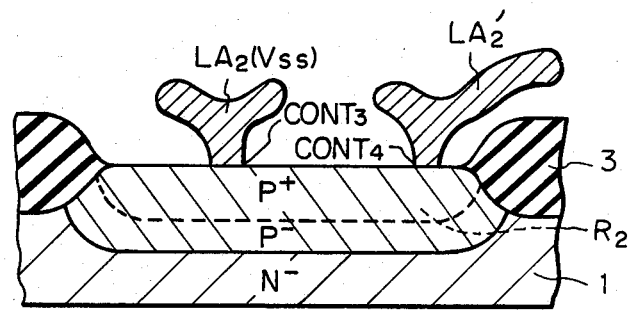
FIG. 18 is a plan view taken along the line XVIII—XVIII of FIG. 17.

A clip is performed upon the single column type array as illustrated in FIG. 15, thereby obtaining a single column type array as shown in FIG. 17. Note that FIG. 18 is a cross-sectional view taken along the line XVIII—XVIII of FIG. 17. In this case, a gate G is clipped at $V_{SS}$ when no power supply line is provided along the traverse connection area CH′. That is, N+ impurity diffusion region $R_2$ is connected via a contact $CONT_3$ to the power supply line $LA_2$ ($V_{SS}$). Therefore, in the case of clipping the gate G to $V_{SS}$, the gate G is connected by a layer $LA_2'$, which is the same layer as the line $LA_2$, through a contact $CONT_4$ to the impurity diffusion region $R_2$. Thus, the gate G is connected to the power supply $V_{SS}$.

Also, in FIG. 17, in the case of clipping the gate G to $V_{CC}$, the left side of the gate G is connected to the N+ impurity diffusion region $R_1$.

Figure 19:
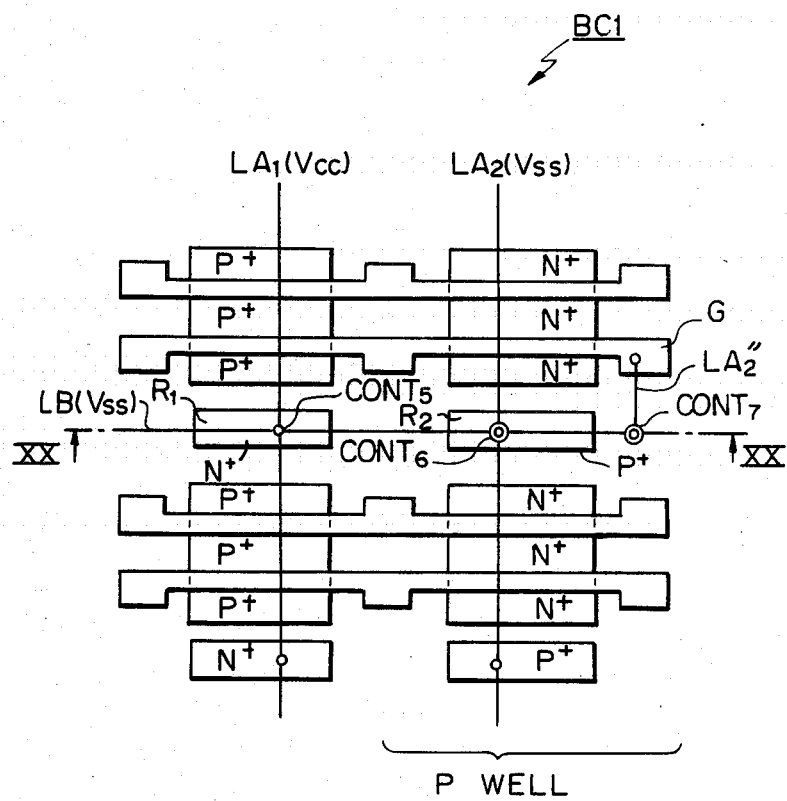
FIG. 19 is a plan view of a clip method according to the present invention applied to the single column type array of FIG. 16.
Figure 20:
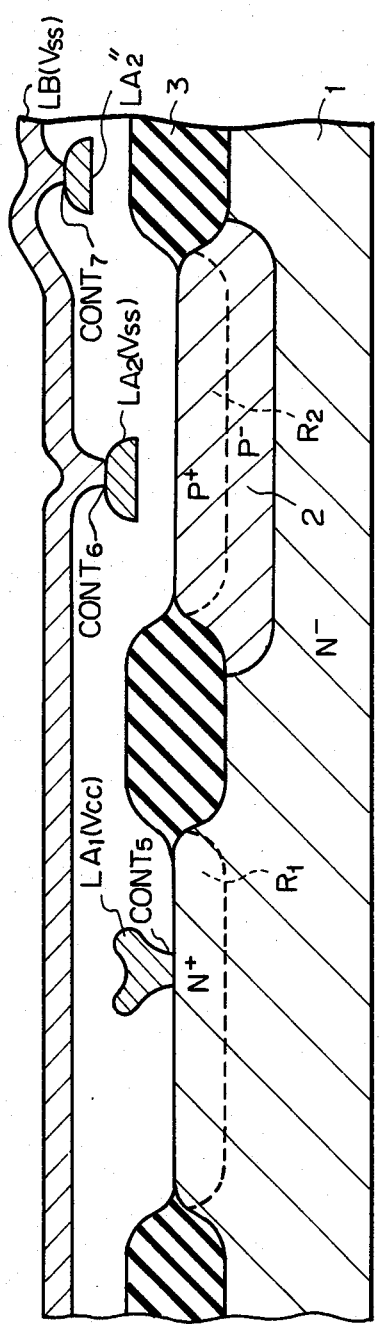
FIG. 20 is a plan view taken along the line XX—XX of FIG. 19.

A clip is performed upon the single column type array as shown in FIG. 16, thereby obtaining a single column type array as shown in FIG. 19. Note that FIG. 20 is a cross-sectional view taken along the line XX—XX of FIG. 19. In this case, a gate G is clipped at $V_{SS}$ when a power supply line LB ($V_{SS}$) is provided along the traverse connection area CH′. That is, the power supply line $LA_1$ is connected via a contact $CONT_5$ to the N+ impurity diffusion region $R_1$, but the power supply line $LA_2$ is not connected to the P+ impurity diffusion region $R_2$. Rather, the power supply line $LA_2$ is connected via a contact $CONT_6$ to the traverse power supply line LB ($V_{SS}$), since double contacts are prohibited so as to avoid disconnections. In this case, the P+ impurity diffusion region $R_2$ is connected via the high resistance P well 2 to another P+ impurity diffusion region, so that the region $R^2$ remains at $V_{SS}$. Therefore, a clip is carried out by connecting the gate G via the contact $CONT_7$ to the traverse power supply line LB, which is also connected to the power supply line $LA_2$.

Figure 14:
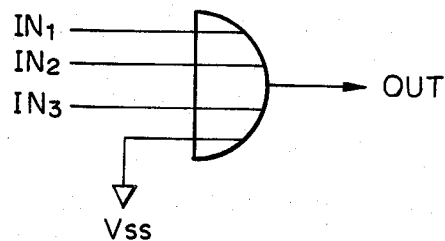

Also, in FIG. 14, in the case of clipping the gate G to $V_{CC}$, the left side of the gate G is connected to the N+ impurity diffusion region $R_1$.

Thus, in the case of clipping a gate to $V_{SS}$, when a power supply line for $V_{SS}$ is provided in a traverse connection channel adjacent thereto, the gate is connected to that power supply line, and when no power supply line is provided in the traverse connection channel, the gate is connected to an impurity diffusion region for avoiding the latch-up phenomenon. Similarly, in the case of clipping a gate to $V_{CC}$, when a power supply line for $V_{CC}$ is provided in a traverse connection channel adjacent thereto, the gate is connected to that power supply line, and when no power supply line is provided in the traverse connection channel, the gate is connected to an impurity diffusion region for avoiding latch-up.

Figure 21:
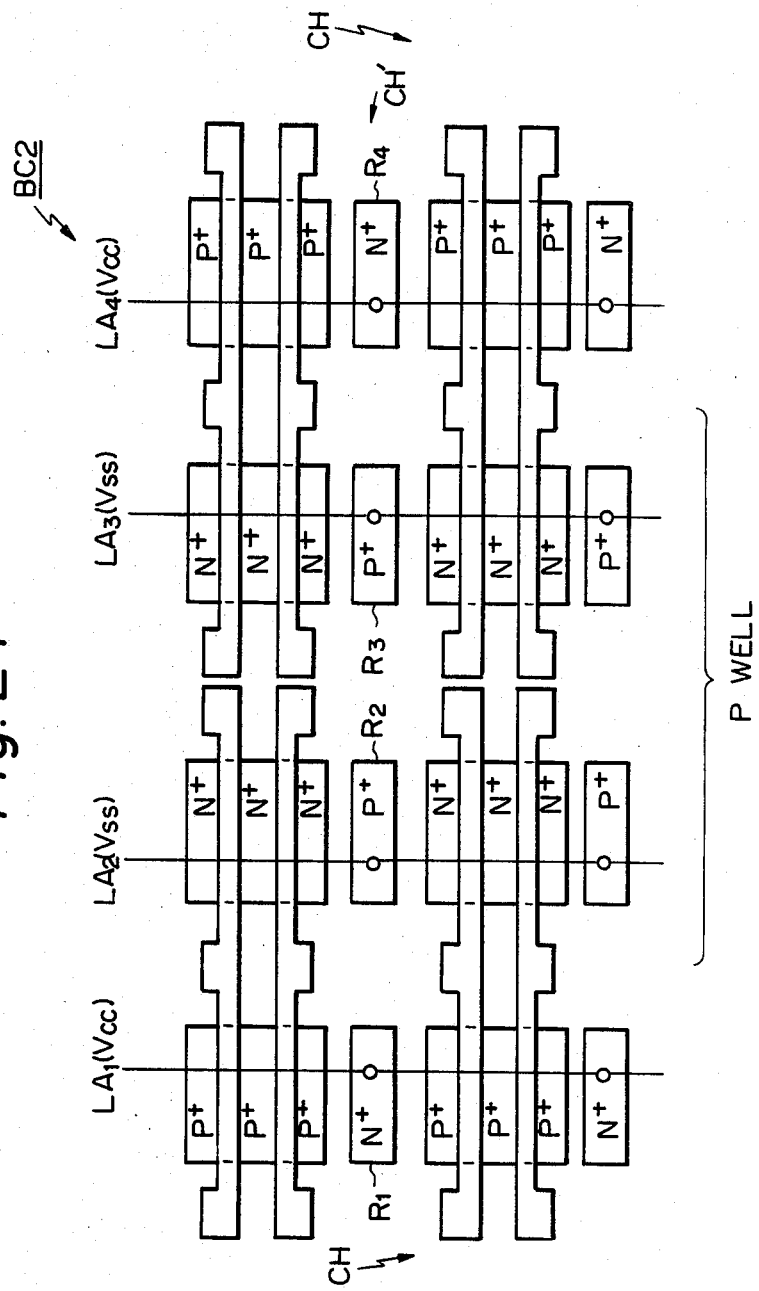
FIG. 21 is an enlargement of the double column type array of FIG. 9, in which impurity diffusion regions are provided for avoiding the latch-up phenomenon.

In FIG. 21, which is an enlargement of the double column type array BC2 of FIG. 8, traverse connection areas CH′ are provided between the basic cells of the double column type array BC2. Note that such traverse connection areas CH′ are common to those of FIG. 15. Also, formed in each of the traverse connection areas CH′ are impurity diffusion regions $R_1$, $R_2$, $R_3$, and $R_4$ for avoiding the latch-up phenomenon peculiar to the CMIS configuration. That is, the impurity diffusion regions $R_1$ and $R_4$, which are, in this case, N+ type, are used for producing a negative bias voltage in the substrate 1 (FIGS. 2 to 4), while the impurity diffusion regions $R_2$ and $R_3$, which are, in this case, P+ type, produce a positive bias voltage in the P well 2 (FIGS. 2 to 4). For this purpose, the N+ impurity diffusion regions $R_1$ and $R_4$ are connected via contacts to the power supply connection layers $LA_1$ ($V_{CC}$) and $LA_4$ ($V_{CC}$), respectively, and the P+ impurity diffusion regions $R_2$ and $R_3$ are connected via contacts to the power supply lines $LA_2$ ($V_{SS}$) and $LA_3$ ($V_{SS}$), respectively.

Figure 22:
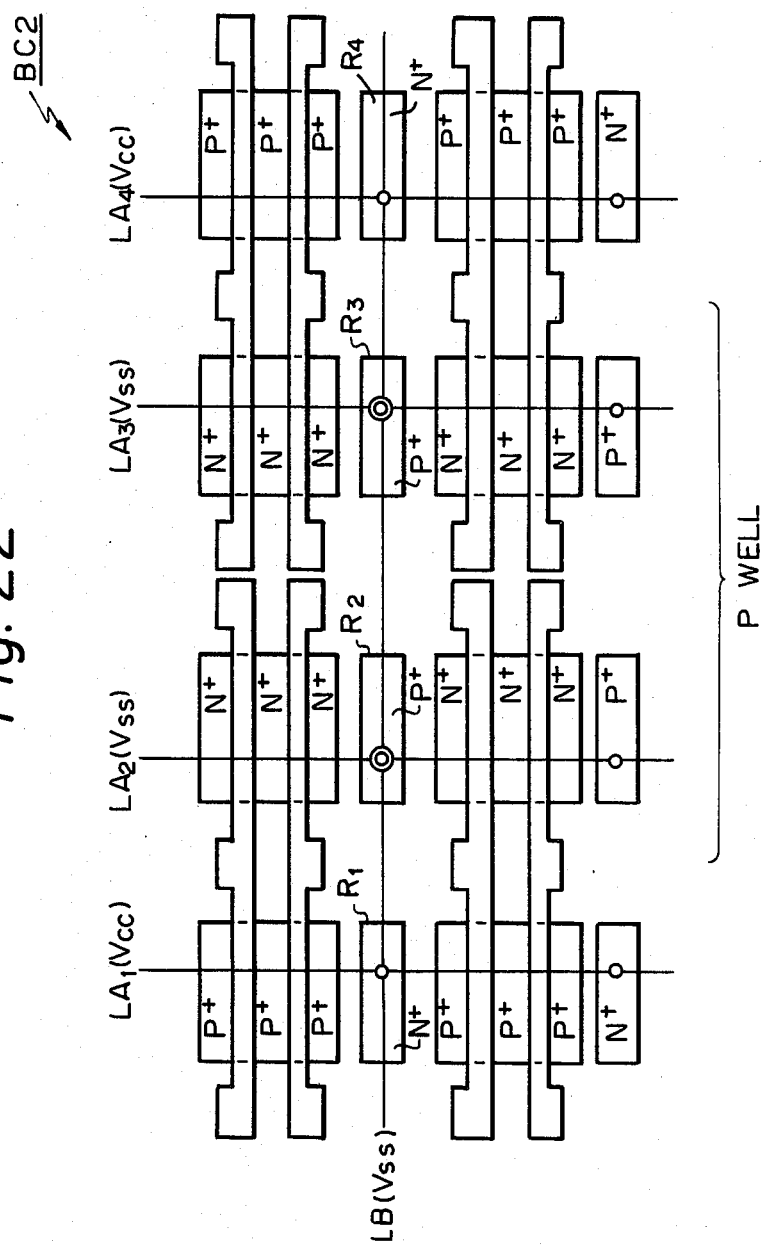
FIG. 22 is a modification of FIG. 21, in which a power supply line is added thereto.

In FIG. 22, which is a modification of FIG. 21, in addition to the longitudinal power supply connection layers $LA_1$, $LA_2$, $LA_3$, and $LA_4$, a traverse power supply connection layer LB is added to reduce the impedance of the power supply lines, for unit cells. In FIG. 22, note that the traverse power supply connection layer LB ($V_{CC}$) is connected to the longitudinal connection layers (in this case, $LA_2$ and $LA_3$), but the connection layers $LA_2$ and $LA_3$ are not connected to the P+ impurity diffusion regions $R_2$ and $R^3$. That is, in order to avoid disconnections, double contacts are prohibited.

A clip method for a double column type array having traverse connection areas for impurity diffusion regions and traverse power supply connection layers will be explained below.

In a double column type array BC2, since the transistors are formed in the sequence P type-N type-N type-P type or N type-P type-P type-N type, i.e., they have an "image by inversion" relationship so as to avoid the latch-up phenomenon, the power supply potential on the outside of the array is usually different from the power supply potential on the inner side of the array. Therefore, a request is generated for clipping the inside a gate potential to a desired potential.

Figure 24:
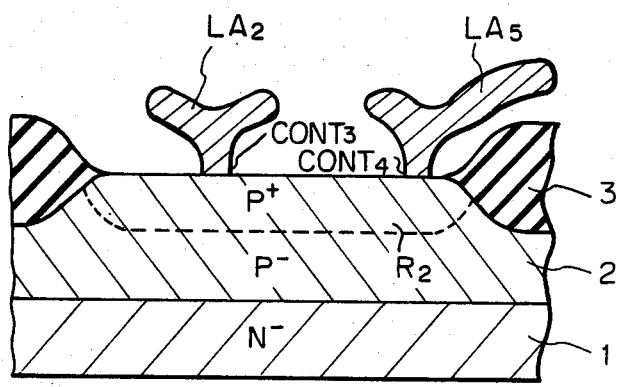
FIG. 24 is a plan view taken along the line XXIV—XXIV of FIG. 23.
Figure 23:
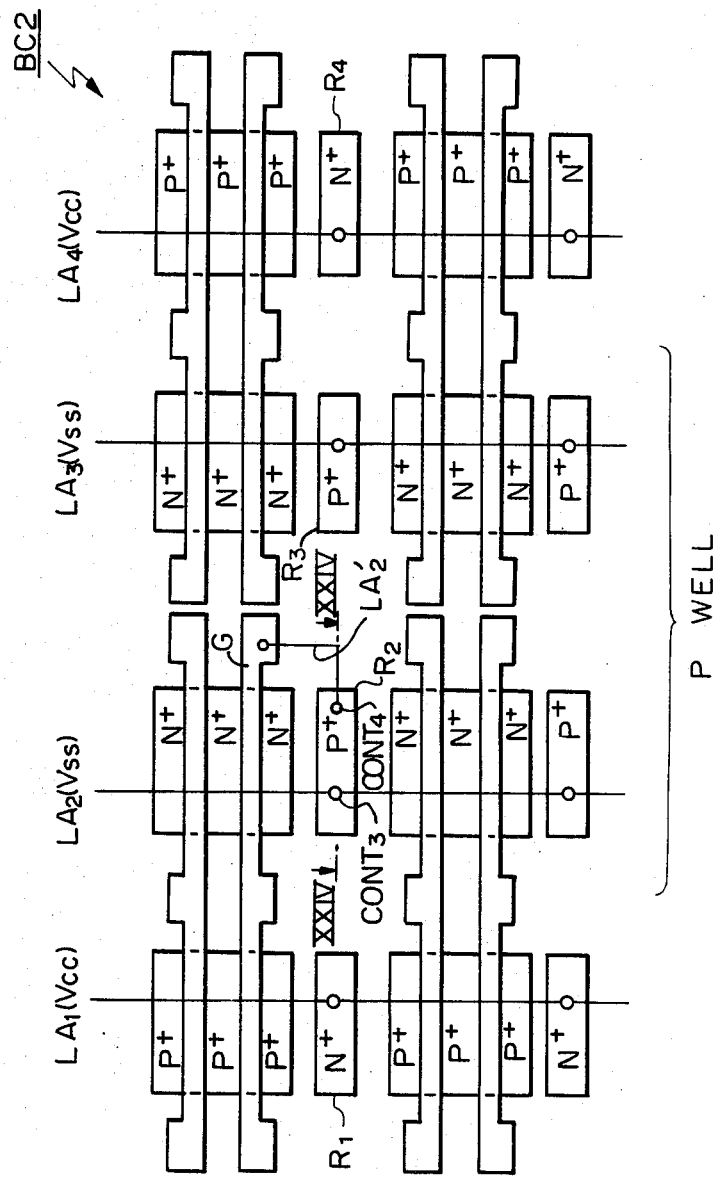
FIG. 23 is a plan view of a clip method according to the present invention applied to the single column array of FIG. 21.

A clip operation is performed upon the double column type array as illustrated in FIG. 21, thereby obtaining a double column type array as shown in FIG. 23. Note that FIG. 24 is a cross-sectional view taken along the line XXIV—XXIV of FIG. 23. In this case, a gate G is clipped at $V_{SS}$ when no power supply line is provided along the traverse connection area CH'. That is, the N+ impurity diffusion region $R_2$ is connected via a contact $CONT_{3}$ $_{l\ to\ the\ power\ supply\ line\ LA2}$ ($V_{SS}$). Therefore, in the case of clipping the gate G to $V_{SS}$, the gate G is connected to a layer $LA_2'$, which is the same layer as the lines $LA_2$ and $LA_3$, through a contact $CONT_4$ to the impurity diffusion region $R_2$. Thus, the gate G is connected to the power supply $V_{SS}$.

Also, in FIG. 23, in the case of clipping the gate G to $V_{CC}$, the left side of the gate G is connected to the N+ impurity diffusion region $R_1$, in the same way as in a single column type array.

Figure 25:
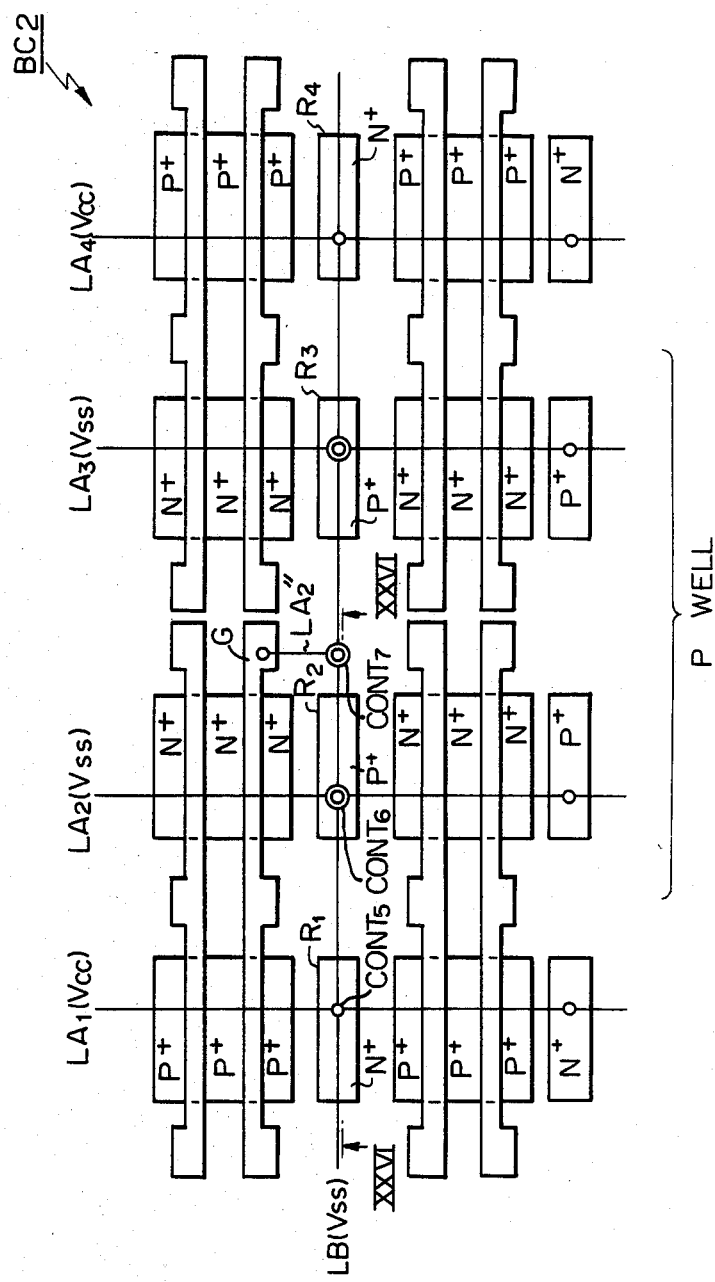
FIG. 25 is a plan view of a clip method according to the present invention applied to the single column array of FIG. 22.
Figure 26:
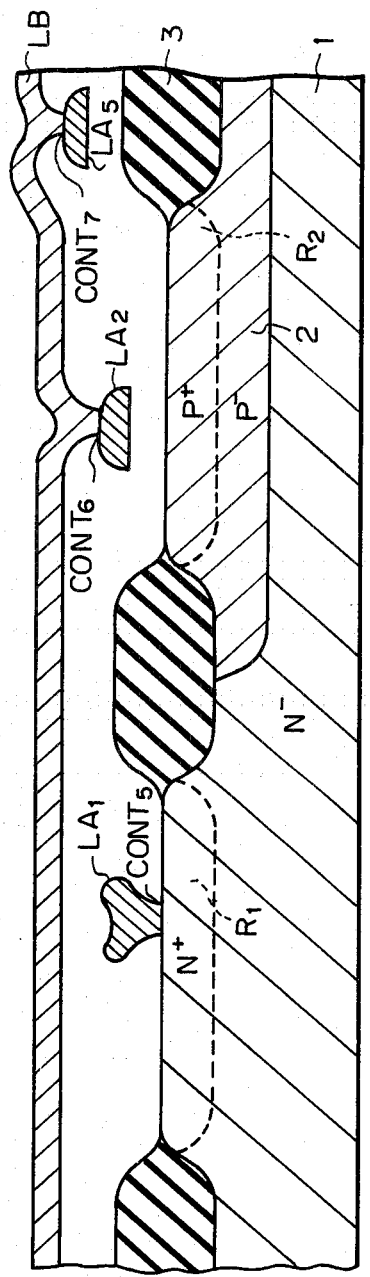
FIG. 26 is a plan view taken along the line XXVI—XXVI of FIG. 25.

A clip operation is performed upon the double column type array as illustrated in FIG. 22, thereby obtaining a double column type array as shown in FIG. 25. Note that FIG. 26 is a cross-sectional view taken along the line XXVI—XXVI of FIG. 25. In this case, the gate G is clipped at $V_{SS}$ when a power supply line LB ($V_{SS}$) is provided along the traverse connection area CH'. That is, the power supply line $LA_1$ is connected via a contact $CONT_5$ to the N+ impurity diffusion region $R_1$, but the power supply line $LA_2$ is not connected to the P+ impurity diffusion region $R_2$. Rather, the power supply line $LA_2$ is connected via a contact $CONT_6$ to the traverse power supply line LB ($V_{SS}$), since double contacts are prohibited. In this case, the P+ impurity diffusion region $R_2$ is connected via the high resistance P well 2 to another P+ impurity diffusion region so that the region $R_2$ remains at $V_{SS}$. Therefore, a clip operation is carried out by connecting the gate G via the contact $CONT_7$ to the traverse power supply line LB which is also connected to the power supply line $LA_2$.

Also, in FIG. 25, in the case of clipping the gate G to $V_{CC}$, the left side of the gate G is connected to the N+ impurity diffusion region $R_1$.

Thus, in the case of clipping an inside gate to $V_{SS}$, when a power supply line for $V_{SS}$ is provided in a traverse connection channel adjacent thereto, the gate is connected to the power supply line, and when no power supply line is provided in the traverse connection channel, the gate is connected to an impurity diffusion region for avoiding the latch-up phenomenon. Similarly, in the case of clipping an inside gate to $V_{CC}$, when a power supply line for $V_{CC}$ is provided in a traverse connection channel adjacent thereto, the gate is connected to the power supply line, and when no power supply line is provided, in the traverse connection channel, the gate is connected to an impurity diffusion region for avoiding latch-up.

In the above-mentioned embodiments, the arrangement of transistors within a basic cell is N channel-P channel-P channel-N channel transistors. However, the clip method according to the present invention can be also applied to the arrangement of P channel-N channel-N channel-P channel transistors.

As explained above, in a double column type array, it is necessary to clip the inside potential of a gate. Therefore, it is preferable to provide, in advance, a space especially for clipping the inside of the gates during the design of unit cells.

Figure 27:
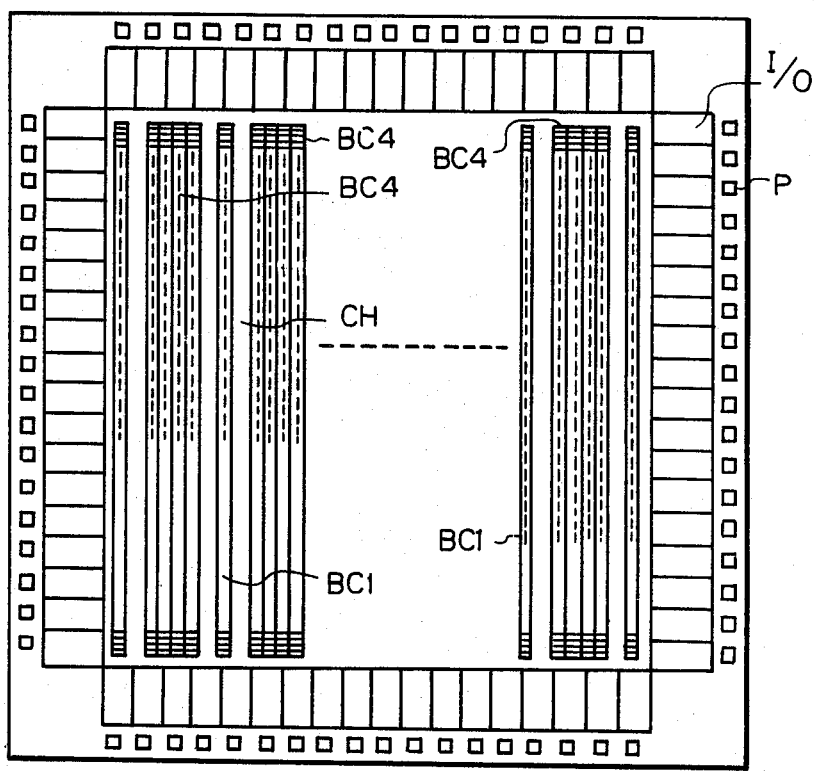
FIG. 27 is a plan view of another embodiment of the gate array integrated device according to the present invention.

In the above-mentioned embodiments, although the arrangement of a single column type array, a double column type array, and a single column type array are repeated, various modifications are possible if a single column type array is opposite to a double column type array. For example, the arrangement of a single column type array and a double column type array can be repeated. Further, other matrix type arrays such as three column type arrays, four column type arrays, and the like can be used instead of double column type arrays. Also, a gate array integrated device using four column type arrays BC4 instead of double column type arrays BC2 is illustrated in FIG. 27. However, in such a matrix type array such as a three column type array or the like, manual design of connections within a basic cell is carried out as occasion demands.

In the above-mentioned embodiments, although a basic cell is constructed by two P-channel transistors and two N-channel transistors, each P-channel/N-channel transistor pair having commonly connected gates. The basic cell can also be constructed by more than three P-channel transistors and the same number of N-channel transistors, such that each P-channel/N-channel transistor pair has commonly connected gates.

Figure 28:
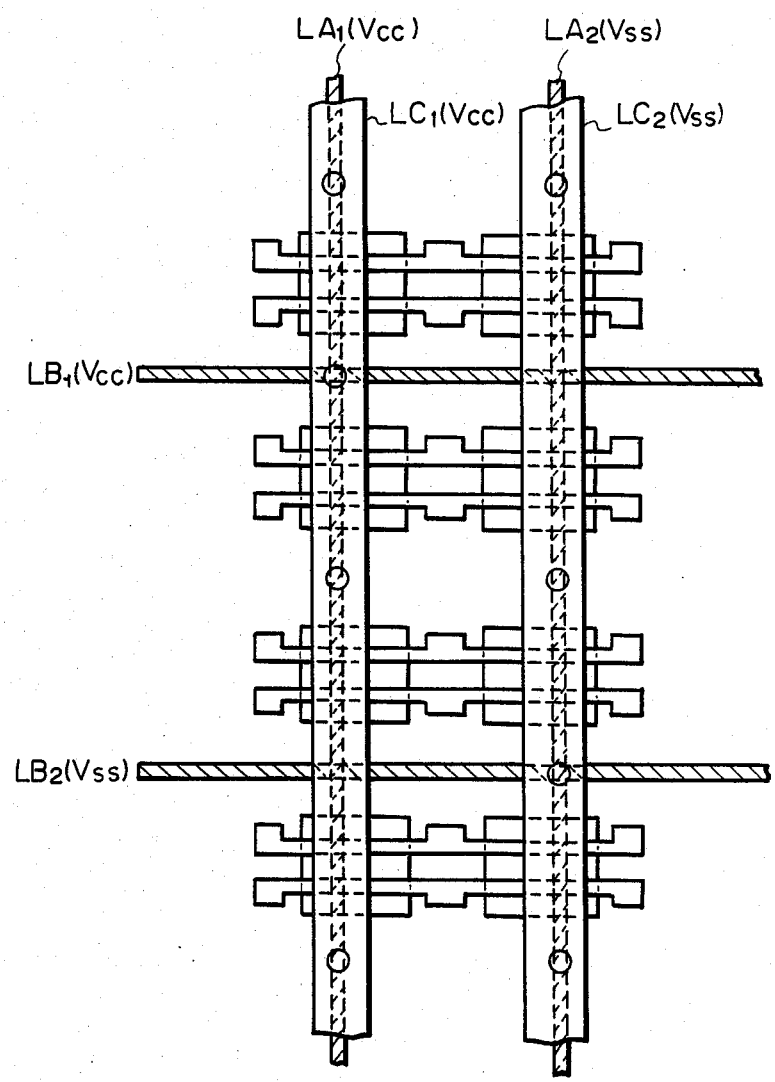
FIG. 28 is a plan view having additional power supply lines according to the present invention.

In the above-mentioned description, to reduce the impedance of the power supply lines, the traverse power supply lines LB are provided. However, to further reduce the impedance of the power lines, additional longitudinal power supply lines can be provided. That is, as illustrated in FIG. 28, longitudinal power supply lines $LC_1$ ($V_{CC}$) and $LC_2$ ($V_{SS}$) are provided over the longitudinal power supply lines $LA_1$ ($V_{CC}$) and $LA_2$ ($V_{SS}$), respectively. The power supply line $LC_1$ ($V_{CC}$) is connected via appropriate contacts to the longitudinal power supply line $LA_1$ ($V_{CC}$) and the traverse power supply line $LB_1$ ($V_{CC}$), and the power supply line $LC_2$ ($V_{SS}$) is connected via appropriate contacts to the longitudinal power supply line $LA_2$ ($V_{SS}$) and the traverse power supply line $LB_2$ ($V_{SS}$). Of course, double contacts are prohibited. Further, the power supply lines $LA_1$ and $LA_2$ are made of a first aluminium layer, the power supply lines $LB_1$ and $LB_2$ are made of a second aluminium layer, and the power supply lines $LC_1$ and $LC_2$ are made of a third aluminium layer.

Since the power supply lines $LC_1$ and $LC_2$ of the third layer are deposited on insulating layers having a relatively large step, the power supply lines $LC_1$ and $LC_2$ can be easily disconnected. To avoid this, the power supply lines $LC_1$ and $LC_2$ are wider than the power supply lines $LA_1$, $LA_2$, $LB_1$, and $LB_2$, which is possible since only a small number of lines other than the power supply lines such as $LC_1$ are made of the third aluminium layer. Thus, the power supply impedance between the basic cells and the power supplies can be remarkably reduced.

Figure 29:
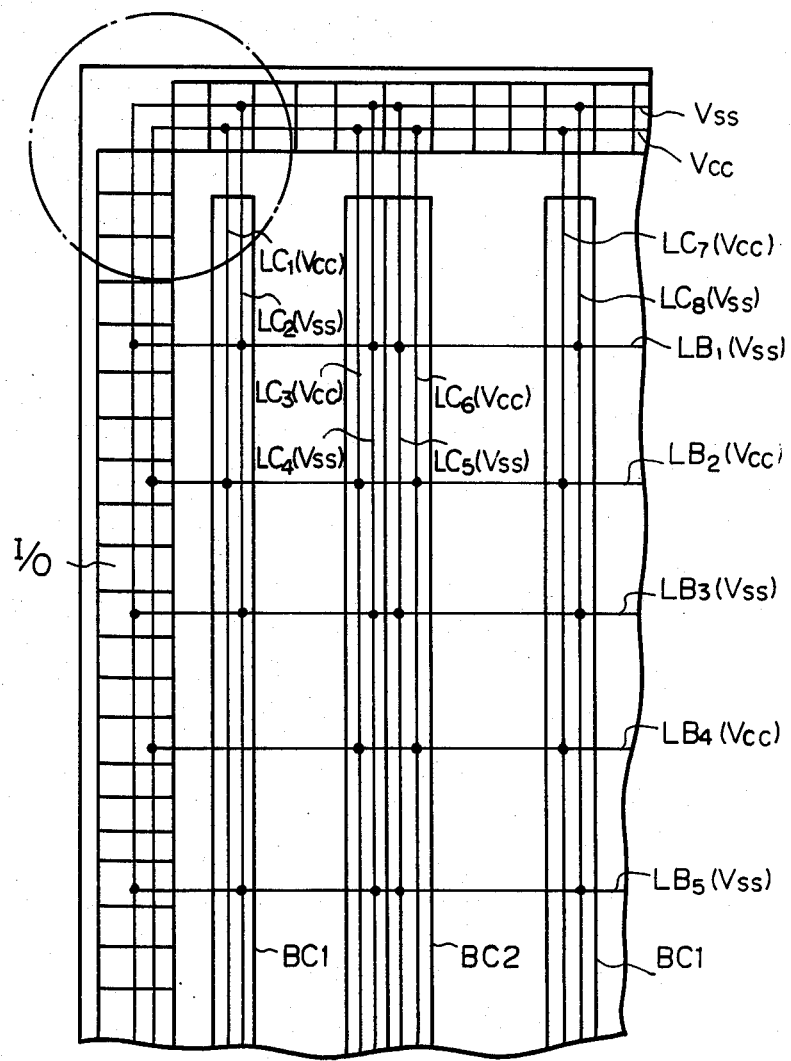
FIG. 29 is a plan view of a gate array integrated device to which the power supply lines of FIG. 28 are applied.
Figure 30:
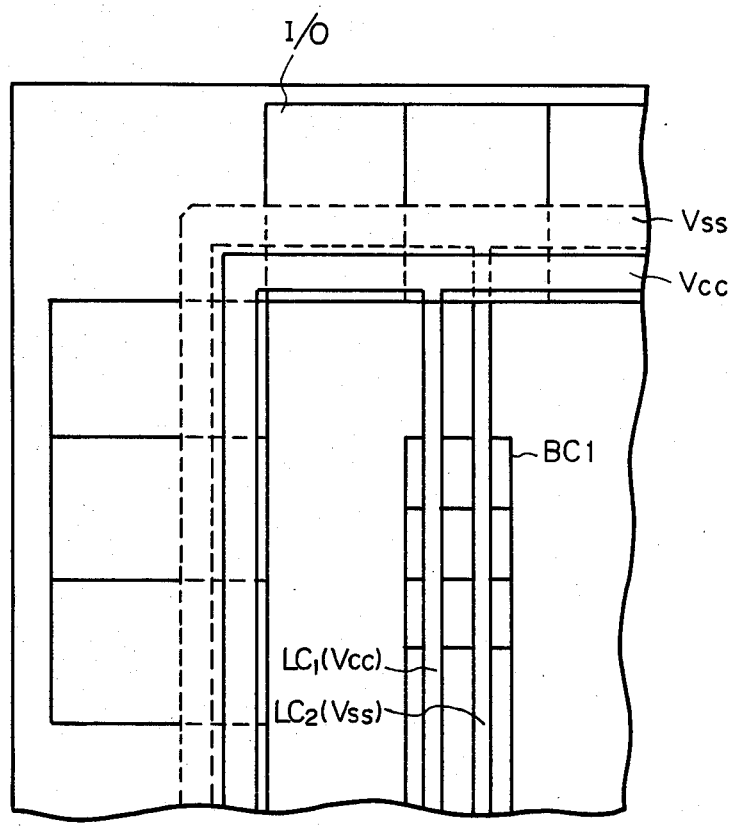
FIG. 30 is an enlargement of the device of FIG. 29.

As illustrated in FIGS. 29 and 30, the configuration of the power supply lines can be applied to the entire device of FIG. 8. Note that, in FIGS. 29 and 30, the first power supply lines such as $LA_1$ of the first aluminium layer are omitted. A main power supply line ($V_{SS}$), which is arranged in the input/output circuits I/O, is made of the third aluminium layer, and a main power supply line ($V_{CC}$), which is also arranged in the input/output circuits I/O, is made of the first or second aluminium layer. The main power supply lines are connected directly or via appropriate contacts to the power supply lines $LA_1$, $LA_2$, ..., $LB_1$, $LB_2$, ..., $LC_1$, $LC_2$, .... Further, the main power supply lines in the input/output circuits I/O are wider than the power supply lines $LC_1$, $LC_2$, ..., thereby further reducing the power supply impedance between the basic cells and the power supplies.

As explained above, according to the present invention, since single column type arrays and matrix type arrays such as double column type arrays are mixed, the integration is improved by the reduction in connection areas due to the reduction of the length and number of connections of the matrix type arrays. Also, non-connections due to limitations on use of the connection areas of the matrix type arrays can be avoided.

What is claimed is:

1. A gate array integrated device comprising:
   a plurality of single column type arrays each including a series of basic cells arranged in columns;
   a plurality of matrix type arrays each including a plurality of arrays arranged in proximity to each other in rows, each of said arrays including a series of basic cells arranged in columns;
   a plurality of first power supply lines arranged in columns over said single column type arrays and said matrix type arrays; and
   longitudinal connection areas, arranged in columns between said single column type arrays and said matrix type arrays, for providing connection areas for connecting said basic cells to each other, thereby creating unit cells,
   each of said matrix type arrays having first and second sides, one of said single column type arrays facing at least one of said first and second sides of each of said matrix type arrays.

2. A device as set forth in claim 1, wherein each of said basic cells comprises P-channel transistors and N-channel transistors.

3. A device as set forth in claim 2, wherein adjacent ones of said arrays within one of said matrix type arrays have an "image by inversion" relationship with respect to each other regarding the arrangement of said P-channel and N-channel transistors.

4. A device as set forth in claim 1, wherein said basic cells have gates, further comprising:
   traverse connection areas arranged in rows between said basic cells of said single column type arrays and said matrix type arrays;
   impurity diffusion regions, formed on said traverse connection areas and crossing said single column type arrays, for providing a substrate bias thereto;
   a plurality of second power supply lines arranged on said traverse connection areas;
   means, operatively connected to said single column type arrays and said first and second power supply lines, for clipping one of said gates of said basic cells in said single column type arrays to one of said first and second power supply lines; and
   means, operatively connected to said single column type arrays and said impurity diffusion regions, for clipping one of said gates of said basic cells in said single column type arrays to one of said impurity diffusion regions formed in said traverse connection area adjacent to said basic cells when said first and second power supply lines do not have a desired potential.

5. A device as set forth in claim 4, further comprising a plurality of third power supply lines each arranged over and connected to said first power supply lines, respectively.

6. A device as set forth in claim 5, wherein said third power supply lines are wider than said first power supply lines.

7. A device as set forth in claim 1, further comprising:
   traverse connection areas arranged in rows between said basic cells of said single column type arrays and said matrix type arrays;
   impurity diffusion regions, formed on said traverse connection areas and crossing said matrix column type arrays, for providing a substrate bias thereto;
   a plurality of second power supply lines arranged on said traverse connection areas;
   means, operatively connected to said matrix type arrays and one of said first and second power supply lines, for clipping one of said gates of one of said basic cells in said matrix type arrays to one of said first and second power supply lines; and
   means, operatively connected to said impurity diffusion regions and said matrix type arrays, for clipping one of said gates of one of said basic cells in said matrix type arrays to one of said impurity diffusion regions formed in said traverse connection areas adjacent to said one of said gates.

8. A device as set forth in claim 7, further comprising a plurality of third power supply lines each arranged over and connected to said first power supply lines, respectively.

9. A device as set forth in claim 8, wherein said third power supply lines are wider than said first power supply lines.

10. A gate array integrated device comprising:
    matrix type arrays arranged in columns and including basic cells;
    single column type arrays arranged in columns between said matrix type arrays and including basic cells;
    longitudinal connection areas, arranged between said matrix type arrays and said single column type arrays for connecting said basic cells;
    traverse connection areas arranged between said basic cells of said matrix cell arrays and said basic cells of said single column type arrays and perpendicular to said longitudinal connection areas;
    first power supply lines formed on said matrix type arrays and said single column type arrays; and
    second power supply lines perpendicular to said first power supply lines and formed on said traverse connection areas.

* * * * *

UNITED STATES PATENT AND TRADEMARK OFFICE
CERTIFICATE OF CORRECTION

PATENT NO. : 4,661,815

DATED : APRIL 28, 1987

INVENTOR(S) : YOSHIHISA TAKAYAMA ET AL.

It is certified that error appears in the above-identified patent and that said Letters Patent is hereby corrected as shown below:

Col. 6, line 30, "$R^2$" should be --$R_2$--.

Col. 7, line 13, "$R^3$" should be --$R_3$--;

line 36, "LA2" should be --$LA_2$--.

Signed and Sealed this

Twenty-fifth Day of August, 1987

Attest:

DONALD J. QUIGG

Attesting Officer     Commissioner of Patents and Trademarks